United States Patent
Lattimore et al.

[11] Patent Number: 6,157,216
[45] Date of Patent: Dec. 5, 2000

[54] CIRCUIT DRIVER ON SOI FOR MERGED LOGIC AND MEMORY CIRCUITS

[75] Inventors: George McNeil Lattimore; Donald George Mikan, Jr., both of Austin; Binta Minesh Patel, Round Rock; Gus Wai-Yan Yeung, Austin, all of Tex.

[73] Assignee: International Business Machines Corporation, Armonk, N.Y.

[21] Appl. No.: 09/296,875

[22] Filed: Apr. 22, 1999

[51] Int. Cl.[7] .............................................. H03K 19/0175
[52] U.S. Cl. ................................ 326/83; 326/81; 326/17; 327/534
[58] Field of Search ............................. 326/83, 112, 119, 326/121, 17, 81; 327/534, 535

[56] References Cited

U.S. PATENT DOCUMENTS

| | | | |
|---|---|---|---|
| 5,405,795 | 4/1995 | Beyer et al. ................................ | 437/41 |
| 5,552,723 | 9/1996 | Shigehara et al. ......................... | 326/86 |
| 5,559,368 | 9/1996 | Hu et al. .................................... | 257/369 |
| 5,939,936 | 8/1999 | Beiley et al. ............................. | 327/537 |

OTHER PUBLICATIONS

"SOI Technology: IBM's Next Advance In Chip Design", available via the Internet at *http://www.chips.ibm.com.*, pp. 1–10.

Michael L. Alles, "Thin–film SOI Emerges", available via the Internet at *http://www. spectrum.ieee.org/spectrum/jun97/features/soi.html*, pp. 1–10.

*Primary Examiner*—Michael Tokar
*Assistant Examiner*—Anh Tran
*Attorney, Agent, or Firm*—Kelly K. Kordzik; Winstead Sechrest & Minick P.C.; Anthony V. S. England

[57] ABSTRACT

A silicon-on-insulator digital circuit combination having a body voltage control stage and a voltage clamp stage. The body voltage control stage is responsive to an input control signal to provide an output driver signal. The body voltage control stage has a first transistor with a terminal for electrically-coupling to a combinational logic circuit, and a body contact electrically-coupled to the input control signal such that a threshold voltage of the transistor is reduced when the transistor is placed in an active state. It can be readily appreciated that the reduced threshold voltage of the transistor increases the transition rate for the first transistor to an inactive state in response to the input control signal. The voltage clamp stage has a second transistor responsive to the input control signal such that the terminal is electrically-coupled to a reference voltage when the first transistor is in the inactive state.

15 Claims, 2 Drawing Sheets

CIRCUIT DRIVER ON SOI FOR MERGED LOGIC AND MEMORY CIRCUITS

TECHNICAL FIELD

The present invention relates to the field of semiconductor circuits, and in particular, to a circuitry for increasing the transition rate between digital logic voltage levels for a silicon-on-insulator semiconductor circuit.

BACKGROUND INFORMATION

The continued scaling of integrated circuit technology toward smaller sizes is making system level integration on a chip both possible and desirable. A chip is understood to be a piece of a semiconductor substrate, such as silicon, having thousands to millions of transistors interconnected to perform a specific function. Scaling of semiconductor circuits has had desirable qualities such as being able to provide system circuitry on a single chip, which in turn increases the speed and capability of the system circuit.

In this manner, a system level integration has merged memory-and-logic functions onto a single chip. Dynamic random-access memory ("DRAM") is attractive for such merged system integration because DRAM cells occupy a small area. Thus, DRAM cells potentially allow a large number of memory cells to be integrated with circuit logic functions.

Nevertheless, as transistors are made smaller and faster, delays through the transistor interconnects become more frequent, limiting the speed of the transistor.

Greater transistor scaling has became possible with the emergence of semiconductor technologies—such as silicon-on-insulator ("SOI")—that can be used for merged system integration. An SOI chip is a layered structure having a relatively thin layer of single-crystal silicon either atop an insulating substrate, such as quartz or sapphire, or separated from a bulk silicon substrate by an electrically insulating layer, which has typically been silicon dioxide.

An SOI structure produces devices with smaller junction areas, simpler isolation structures, and steeper subthreshold-voltage slopes than prior bulk devices. Advantages have been the reduction of parasitic capacitances and leakage currents, as well as the ability to use lower supply and threshold voltages without speed loss.

Generally, capacitance is an electrical characteristic that relates to the ability of a structure to store electrical charge. Typically, a comparatively longer time is required to charge the capacitance, as opposed to the actual time required to simply turn a transistor "on" and "off."

With SOI technology, the junction area capacitance of a transistor is reduced, recognizing speed improvements of 200 to 300 percent, and power reduction up to 90 percent relative to bulk silicon counterparts, as well as operation voltages to below 1-volt (Vdd).

In bulk Complementary Metal-Oxide Semiconductor ("CMOS") device fabrication, well structures and other such isolating structures introduce parasitic effects that are harmful to integrated-circuit performance and place constraints on how tightly devices can be packed. In contrast, the isolation layer of the SOI structure permits high- and low-voltage devices to be integrated in close proximity. The isolation layer also can serve as an etch stop in the patterning of silicon waveguides and fabrication of sensor membranes or 3-D structures. Leakage currents induced thermally or by exposure to radiation are reduced, allowing SOI devices to be used in automotive and space electronics.

Because of the new semiconductor structures associated with SOI technology, circuits have been designed to address the structure nuances in such a manner as to further increase the switching speed of a CMOS device, such as a Metal-Oxide Semiconductor Field-Effect Transistor ("MOSFET").

U.S. Pat. No. 5,559,368, issued Sep. 24, 1996, to Hu et al., discloses an integrated circuit for operating at an ultra-low voltage of 0.6 volts or less for circuits implementing large transistors used in clock drivers and large buffers. The structure disclosed is a MOSFET formed in an SOI structure that includes a gate to body connection to provide a forward body-bias for a transistor. The transistor is forward body-biased to enhance the current drive of the device.

Apart from silicon-on-insulator power source concerns, a present need exists to further increase the transition rate for SOI-based devices to further capitalize on the characteristics of SOI technology, as well as to bring an interconnecting node for dynamic-circuits to a known level for predictable circuit behavior. Also, a need exists for these characteristics in a driver circuit coupled to a circuit load.

SUMMARY OF THE INVENTION

Accordingly, provided is a silicon-on-insulator driver circuit having a body voltage control stage and a voltage clamp stage. The body voltage control stage is responsive to an input control signal to provide an output driver signal.

The body voltage control stage has a first transistor with a terminal for electrically-coupling to a combinational logic circuit, and a body contact electrically-coupled to the input control signal such that a threshold voltage of the transistor is reduced when the transistor is placed in an active state. It can be readily appreciated that the reduced threshold voltage of the transistor reduces the delay time as measured from the transistor drain region to transition from a logic "1" voltage level to a logic "0" voltage level. The voltage clamp stage has a second transistor responsive to the input control signal such that the terminal is electrically-coupled to a reference voltage when the first transistor is in the inactive state.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
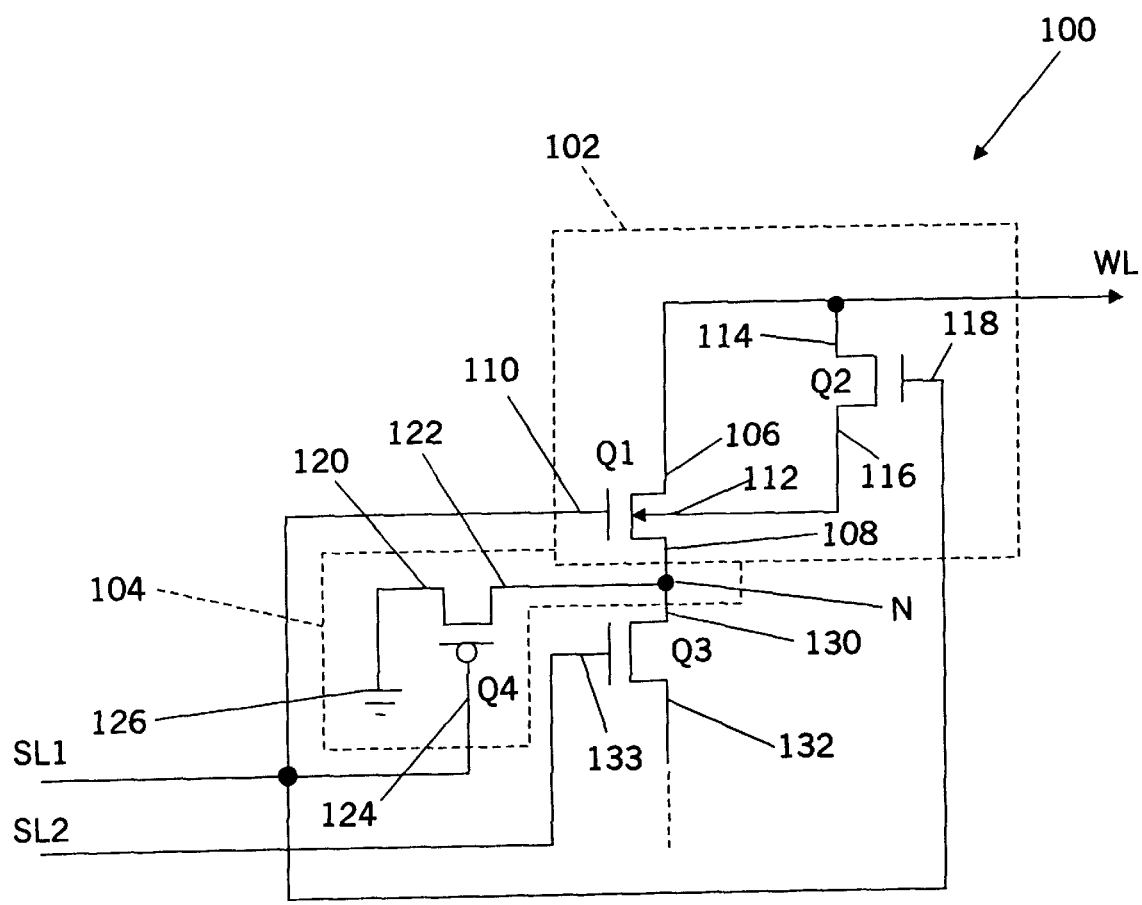
FIG. 1 is a circuit level schematic of an improved driver circuit of the present invention for use with dynamic and static SOI-based integrated circuits.

In the following description, numerous specific details are set forth to provide a thorough understanding of the present invention. It should be noted, however, that those skilled in the art are capable of practicing the present invention without such specific details. It will also be understood that the present invention can be implemented in conventional SOI (Silicon On Insulator) MOSFET (Metal Oxide Semiconductor Field Effect Transistor) technology, and that the described embodiments will operate accordingly if designed and fabricated in accordance with known SOI and CMOS (Complementary Metal Oxide Semiconductor) rules and methodologies. These rules and methodologies are known to those skilled in the art and are not repeated below except to the extent it may be necessary to fully set forth the present invention.

Refer now to the drawings wherein depicted elements are not necessarily shown to scale and wherein like or similar elements are designated by the same reference numeral through the several views.

Referring first to FIG. 1, shown is a circuit level schematic of an improved driver circuit 100 for use with SOI technology. The improved driver circuit has a body voltage control stage 102 for decreasing the time to drive from a logic "1" voltage level to a logic "0" voltage level on the line WL, and a voltage clamp stage 104.

Each stage is implemented with MOSFETs having a conductivity type n-doped or p-doped, which are also referred to a nMOS or pMOS, accordingly. In the embodiment shown in FIG. 1, the control stage 102 has nMOS transistors Q1 and Q2, and the voltage clamp stage 104 has a pMOS transistor Q4.

The body voltage control stage 102 has a first transistor Q1 having a drain terminal 106, a source terminal 108, a gate terminal 110, and a body terminal 112. The labels of "source" and "drain" is for referencing connections, and it should be noted that the diffusion regions of the transistor component can function as either a "source" or a "drain" according to the direction of the electric current flowing therethrough. In the context of SOI technology, the term body terminal is also referred to as a "body contact," which is an electrical-coupling with the body of the integrated circuit, and can be specific to transistors defined on the integrated circuit. A discussion of SOI semiconductor structures is found in U.S. Pat. No. 5,784,311, issued Jul. 21, 1998 to Assaderaghi et al., which is incorporated herein by reference. Preferably, a body terminal, or body contact, has low capacitance, and occupies a space comparable to the transistor providing the body terminal.

The drain terminal 106 is electrically-coupled to a drain terminal 114 of a second transistor Q2, which also provides an electrical node providing the signal line WL. A source terminal 116 of transistor Q2 is electrically-coupled to the body terminal 112 of the first transistor Q1.

The gate terminal 118 of the transistor Q2 and the gate terminal 110 of the transistor Q1 are electrically-coupled to signal line SL1. In this manner, when the signal line SL1 goes to a logic "1" voltage, then the transistor Q1 and the transistor Q2 are placed in an ON state. The electrically-coupled source terminal 116 of the transistor Q2 to the body terminal 112 of the first transistor Q1 diminishes the threshold voltage $V_T$ of the transistor Q1 (that behavior will occur only if WL is at a higher potential than node 116. The threshold voltage $V_T$ is the amount of gate-to-source voltage needed to generate a conducting channel in the transistor Q1, as is known by those skilled in the art.

Because the body of the transistor Q1 is charged by transistor Q2, the value of the threshold voltage $V_T$ is reduced, increasing the speed of the transistor Q1 to transition from a $V_{DD}$ voltage to a ground voltage level with respect to the drain region of Q1. That is, when line WL is at a logic "1" voltage, a positive voltage signal is asserted to the body terminal 112, improving the channel performance for the transistor Q1 switching the word line WL from a logic "1" voltage level to a logic "0" voltage level. The charging of the integrated circuit body to increase transition speed, or rate, is facilitated by SOI characteristics of low parasitic capacitances as discussed above in detail. That is, time is not spent charging and discharging capacitances common to other semiconductor technologies.

The voltage clamp stage 104 has a transistor Q4 with a drain terminal 120, a source terminal 122, and a gate terminal 124. The drain terminal 120 is electrically-coupled to a ground voltage source 126. The source terminal 122 is electrically-coupled to the source terminal 108 of the transistor Q1. The gate terminal 124 is electrically coupled to the signal line SL1.

The voltage clamp stage 104 provides a known voltage to the node N when the transistor Q1 is OFF. That is, when the input from the signal line SL1 is at a logic "0" voltage, the MOSFET Q4 is ON. Conversely, the transistors Q1 and Q2 are OFF. The transistor Q1 is without the voltage charge provided at the body terminal 112 through the drain terminal 116 of the transistor Q2. The transistor Q4 electrically-couples the source terminal 108 of the transistor Q1 to the ground voltage source 126.

The voltage clamp stage 104 may be implemented in combination with dynamic circuit configurations to provide a known voltage level at the junction between integrated-circuit devices. Further, the voltage clamp stage 104 maintains the drain terminal 108 of the transistor Q1 at a ground level as provided by the ground voltage source 126, the body voltage of transistor Q1 is kept at a low level (if WL is at a lower potential than node 116), providing a high threshold voltage $V_T$. In this manner, the improved driver circuit 100 has higher noise immunity, minimizing unintended signals placed on the signal line WL by noise-induced activation of the circuit 100. Further, the driver circuit 100 is less sensitive to input noise on the line SL1 due to the node N being at a ground level voltage. Accordingly, with the gate-to-source voltage VGS of transistor Q1 at zero volts, the threshold voltage $V_T$ of transistor Q1 is higher than if node N is allowed to float, or left uncoupled to a known positive voltage level.

The improved driver circuit 100 can be used in merged memory-and-logic functions. As shown in FIG. 1, the improved driver circuit is combined with a logic circuit represented by the transistor Q3. The source terminal 130 of the transistor Q3 is coupled to the node N. The drain terminal 132 can be coupled to the ground voltage source 126 or to other transistor circuits forming other logic circuits. The logic circuitry is activated by a logic control line SL2 coupled to the gate terminal 133.

Logic circuits can be static or dynamic in nature. A static logic circuit allows versatile implementation of logic functions based on static, or steady-state, behavior of uncomplex nMOS or CMOS structures. In other words, valid output levels in static gate are associated with steady-state operating points of the circuit in question. Thus, a typical static logic gate generates its output corresponding to the applied input voltages after a certain time delay, and it can preserve its output level (or state) as long as the power supply is provided. This approach, however, may require a large number of transistors to implement a function, and may cause a considerable time delay.

In high-density, high-performance digital implementations where reduction of circuit delay and silicon area is a prime consideration, dynamic logic circuits can offer significant advantages over static logic circuits. The dynamic logic gate operations depend on temporary (transient) storage of charge in parasitic node capacitances, instead of relying on steady-state circuit behavior. This operation property necessitates periodic updating of internal voltage levels, since stored charges in a capacitor cannot be retained indefinitely. Consequently, dynamic logic circuits require periodic clock signals for periodic charge refreshing of transfer, or timing discipline.

The improved driver circuit 100 may be used with an array wordline driver, which is an example of a merged memory-and-logic function circuit. A wordline driver is deployed in a memory array, which has a data storage structure, or core, having memory cells arranged in an array of horizontal rows and vertical columns. Each memory cell is capable of storing one bit of binary information. Each memory cell of a memory array shares a common connection with the other cells in the same row, and another common connection with the other cells in the same column. In this structure, there are $2^N$ rows, also called word lines, and $2^M$ columns, also called bit lines. The total number of memory cells in this array is $2^M \times 2^N$. To access a particular memory cell, the corresponding bit line and the corresponding word line must be selected. The row and column selection operations are accomplished by row and column decoders, respectively.

The driver circuit 100 is a nMOS stage of a circuit driver. Because of the nMOS implementation, the driver circuit 100 is known as a pull-down circuit because the logic switch being facilitated is from a logic "1" voltage level down to a logic "0" voltage level. It should be noted that the driver circuit 100 may also be implemented as a pMOS stage, providing a pull-up variation in which the logic switch is from a logic "0" voltage level up to a logic "1" voltage level.

It should be readily appreciated by those skilled in the art that the driver circuit 100 may be applied to other circuit configurations requiring a driver circuit component. For example, the driver circuit 100 can be used in dynamic circuits, such as for a dynamic driver, coupled to the signal line WL, having a pMOS configuration of the driver circuit 100 used as a pull-up variation combined with an inverter and a pMOS half-latch circuit.

The driver circuit 100 could be used as a driver where the pull-up structure is supplied by another chip or board, which is known as an open-drain driver. In a further aspect, the driver circuit 100, in an nMOS implementation, can be the nFET tree of a static circuit where the pull-up portion of the static circuit is the same doped-variation (nMOS or pMOS) as the doped-variation of the circuit devices that are being switched between logic levels.

It can be appreciated by those skilled in the art that the driver circuit of the present invention can be implemented in additional circuit configurations used to drive a circuit load. The circuit shown in FIG. 1 may also be used as a wordline driver circuit implementing nMOS transistors Q1, Q2, and Q3.

Figure 2:
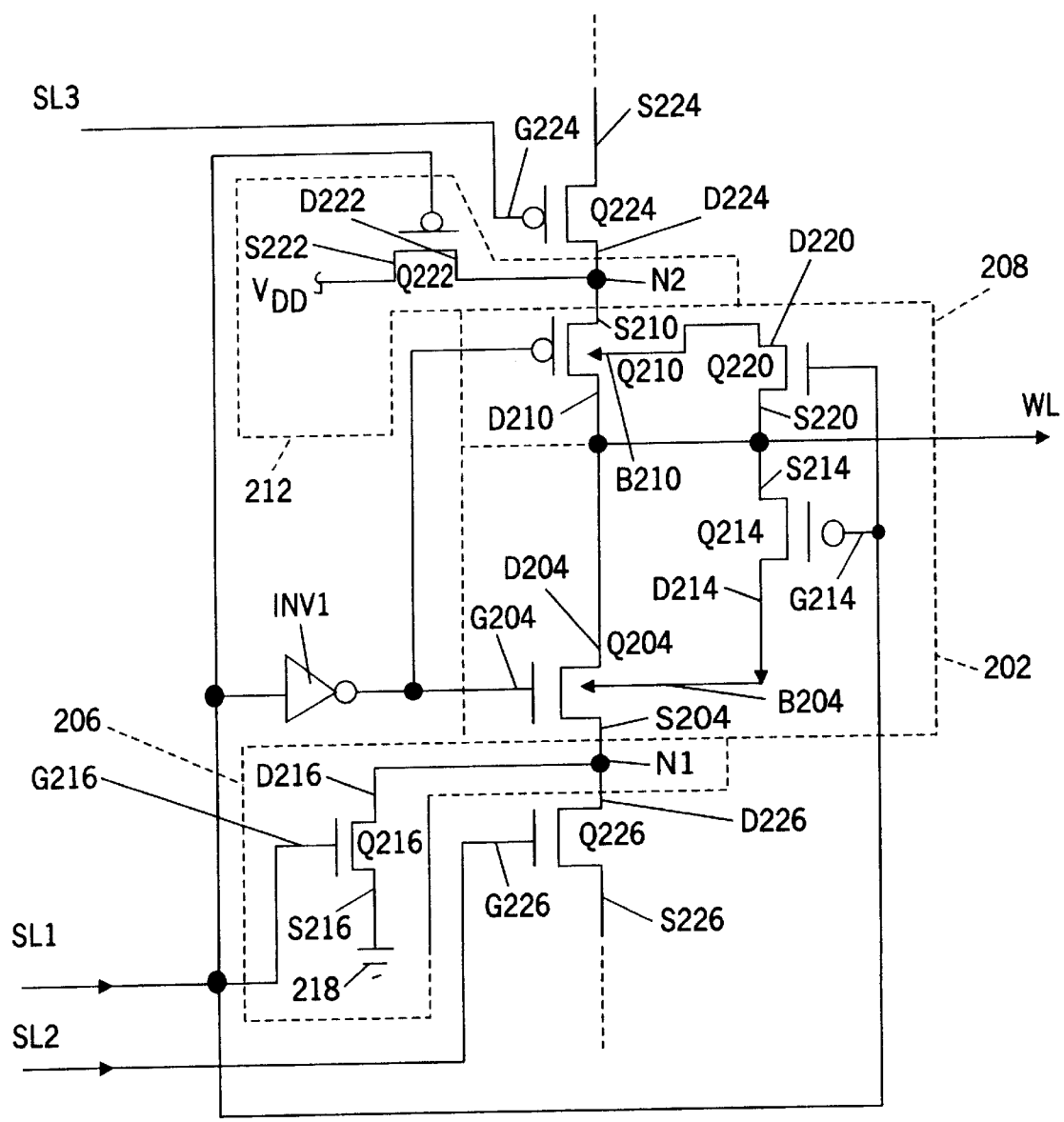
FIG. 2 is a circuit level schematic of the driver circuit of the present invention implemented in a driver circuit to drive circuits having a load.

FIG. 2 is a circuit level schematic of the driver circuit of the present invention implemented in a complementary driver circuit 200. The transistor $Q_{204}$ corresponds to the transistor Q1 of the driver circuit 100. Complementing the pull-down logic switching function of the nMOS transistor $Q_{204}$ is the pMOS transistor $Q_{210}$, which provides a pull-up logic switching function. The complementary structure provides a push-pull driver function coupled to the signal line WL.

In addition to the complementary push-pull driver function, the complementary driver circuit 200 also provides a body precharge to the transistors Q204 and Q210. A body precharge serves to drive a predetermined circuit load with the driver circuit while also enhancing switching rates of these transistor components.

As shown in FIG. 2, there are two logic inversions in the circuit path from the signal line SL1 to the output signal line WL. For comparison, the circuit 100 (see FIG. 1) has one logic inversion from the signal line SL1 to the output signal line WL.

The logic inversions, serve to provide a circuit gain value to drive a predetermined circuit load. The advantage is that in complementary driver circuit 200, the body of either the nMOS transistor $Q_{204}$ or the pMOS transistor $Q_{210}$ is charged before either transistor turns "ON" because of the delay provided by the corresponding inversion through the inverter INV1, which is electrically-coupled to the gate terminals $G_{204}$ and $G_{210}$. Accordingly, a body precharge is provided prior to the turning "ON" of the corresponding nMOS transistor $Q_{204}$ or the pMOS transistor $Q_{210}$. As a result, the precharging of the bodies reduces the respective threshold voltages $V_T$ of the transistors $Q_{204}$ and $Q_{210}$.

The improved driver circuit 200 has a body voltage control stage 202 for decreasing the deactivation time to drive an electrical signal on the line WL through a nMOS transistor $Q_{204}$, and a voltage clamp stage 206 for clamping the interconnecting node $N_1$ to a known voltage when the transistor $Q_{204}$ is OFF.

The driver circuit 200 has a complementary-signal circuit having a body voltage control stage 208 for decreasing the time to switch logic level voltages on the line WL through a pMOS transistor $Q_{210}$ and an nMOS transistor $Q_{204}$, accordingly. The driver circuit 200 also has voltage clamp stages 212 and 206 for clamping the interconnecting node $N_2$ to a known voltage level when the MOSFET $Q_{210}$ is OFF.

The body voltage control stage 202 has a first nMOS transistor $Q_{204}$ with a drain terminal $D_{204}$, a source terminal $S_{204}$, a gate terminal $G_{204}$, and a body terminal $B_{204}$. The labels of "source" and "drain" are for referencing connections, and it should be noted that the diffusion regions of the transistor component can function as either a "source" or a "drain" according to the direction of the electric current flowing therethrough.

A pMOS transistor $Q_{214}$ has a drain terminal $D_{214}$ electrically-coupled to the body terminal $B_{204}$ of the transistor Q204, and a source terminal $S_{214}$ electrically-coupled to the output signal line WL. A gate terminal $G_{214}$ of the transistor $Q_{214}$ is electrically-coupled to an input signal line SL1.

The gate terminal $G_{204}$ of transistor $Q_{204}$ is also electrically-coupled, in FIG. 2, through an inverter INV1 to the signal line SL1.

The voltage clamp stage 206 has a nMOS transistor $Q_{216}$ with a drain terminal $D_{216}$, a source terminal $S_{216}$, and a gate terminal $G_{216}$. The source terminal $S_{216}$ is electrically-coupled to a ground voltage source 218. The drain terminal $D_{216}$ is electrically-coupled to the source terminal $S_{204}$ of the nMOS transistor $Q_{204}$. The gate terminal $G_{216}$ is electrically-coupled to the signal line SL1.

The complementary-signal body voltage control stage 208 has a pMOS transistor $Q_{210}$ with a drain terminal $D_{210}$, a source terminal $S_{210}$, a gate terminal $G_{210}$, and a body terminal $B_{210}$. An nMOS transistor $Q_{220}$ has a drain terminal $D_{220}$ electrically-coupled to the $B_{210}$ of the transistor $Q_{210}$, and a source terminal $S_{220}$ electrically-coupled to the output signal line WL. A gate terminal $G_{220}$ of the transistor $Q_{220}$ is electrically-coupled to an input signal line SL1.

The gate terminal $G_{210}$ of pMOS transistor $Q_{210}$ is also electrically-coupled through the inverter INV1 to the signal line SL1.

The complementary-signal voltage clamp stage 212 has a pMOS transistor $Q_{222}$ with a drain terminal $D_{222}$, a source terminal $S_{222}$, and a gate terminal $G_{222}$. The source terminal $S_{222}$ is electrically-coupled to the voltage source $V_{DD}$. The drain terminal $D_{222}$ is electrically-coupled to the source terminal $S_{210}$ of the pMOS transistor $Q_{210}$. The gate terminal $G_{222}$ is electrically-coupled to the signal line SL1.

The control signal for the improved driver circuit 200 is provided by the input signal line SL1. The circuit status with respect to each of the stages is shown in the following table:

TABLE 1

|  | MOSFET | SL1 = "1" | SL1 = "0" |
| --- | --- | --- | --- |
| Body Voltage Control Stage 202 | $Q_{204}$ | OFF | ON |
|  | $Q_{214}$ | OFF | ON |
| Voltage Clamp Stage 206 | $Q_{216}$ | ON | OFF |
| Complementary-Signal Body Voltage Control Stage 208 | $Q_{210}$ | ON | OFF |
|  | $Q_{220}$ | ON | OFF |
| Complementary-Signal Voltage Clamp Stage 212 | $Q_{222}$ | OFF | ON |

As shown, when the input signal line SL1 goes to a logic "1" voltage, the body voltage control stage 202 is OFF, and the voltage clamp stage 206 is ON. The complementary body voltage control stage 208 is ON, and the complementary clamp stage 212 is OFF. Accordingly, the wordline driver circuit 200 is responsive to the input signal line SL3 through the logic circuitry provided by a pMOS transistor $Q_{224}$. The pMOS transistor has a drain terminal $D_{224}$ electrically coupled to the source terminal $S_{210}$ of the transistor $Q_{210}$.

When the input signal line SL1 goes to a logic "0" voltage, the body voltage control stage 202 is ON, and the voltage clamp stage 206 is OFF. The complementary-signal body voltage control stage 208 is OFF, and the complementary clamp stage 212 is ON.

In the instances when the body voltage control stage 202 and the complementary-signal body voltage control stage 208 are ON, as set out above, the respective electrical coupling of drain terminal $D_{220}$ of the transistor $Q_{220}$ to the body terminal $B_{210}$, and drain terminal $D_{214}$ of the transistor $Q_{214}$ to the body terminal $B_{204}$ of transistor $Q_{204}$ diminishes the threshold voltage $V_T$ of the respective bodies, accordingly. Because the bodies of the transistors $Q_{204}$ and $Q_{210}$ are charged, the respect values of the threshold voltage $V_T$ is reduced, increasing the speed of the transistors $Q_{204}$ and $Q_{210}$ to transition from a voltage source $V_{DD}$ level to a ground voltage level with respect to the drain regions. That is, when a positive/negative voltage signal is asserted to the body terminals $B_{204}$ and $B_{210}$, respectively, the channel performance for each of the transistors $Q_{204}$ and $Q_{210}$ is improved, enhancing the speed in which transition can take place with respect to the output signal line WL when the input signal SL1 transitions between a logic "1" voltage to a logic "0" voltage, and also when the input signal SL1 transitions between a logic "0" voltage to a logic "1" voltage.

Further logic circuitry is implemented to place a signal on the output signal line WL in response to a logic state of the memory array, as is known to those skilled in the art. In FIG. 2, the input signal line SL3 is electrically-coupled to a gate terminal $G_{224}$ of a pMOS transistor $Q_{224}$ to place the transistor in an ON or OFF state. As shown, the drain terminal $D_{224}$ is electrically-coupled to the source terminal $S_{210}$ of the transistor $Q_{210}$. In a complementary fashion with respect to the nMOS transistor circuitry of body voltage control stage 202 and the voltage clamp stage 206, the source terminal $S_{224}$ can be electrically-coupled to the source voltage $V_{DD}$, or to other combinational-logic circuitry as indicated by the phantom lines.

The input signal line SL2 is electrically-coupled to a gate terminal $G_{226}$ of a nMOS transistor $Q_{226}$ to place the transistor in an ON or OFF state. A source terminal $S_{226}$ can be electrically-coupled to additional combinational logic circuitry, as indicated by the phantom lines, but it should be noted that the source terminal $S_{226}$ may instead be electrically-coupled to a voltage ground source 218. A drain terminal $D_{226}$ is electrically-coupled to the node N1.

The combination of the body voltage control stage and the voltage clamp stage of the present invention may be implemented to increase the transition rate for a SOI-based device to further capitalize on the characteristics of SOI technology, as well as to bring an interconnecting node for dynamic-circuits to a known level for predictable circuit behavior, as described above with respect to FIG. 1. Examples of other merged logic-and-memory circuit structures placed on SOI chips, are those circuit structures implementing NAND logic, NOR logic, or other such binary logic circuitry. Furthermore, the present invention has uses in circuit structures other than merged logic-and-memory that may benefit from improved transistor-switching.

Although the present invention and its advantages have been described in detail, it should be understood that various changes, substitutions, and alterations can be made herein without departing from the spirit and scope of the invention as defined by the appended claims.

What is claimed is:

1. A silicon-on-insulator circuit combination comprising:
   a body voltage control stage responsive to an input control signal to provide an output driver signal, said body voltage control stage having a transistor with a terminal for coupling to a combinational logic circuit, and a body contact electrically-coupled to said input control signal such that a threshold voltage of said transistor is reduced whereby said reduced threshold voltage of said transistor increases the rate for said transistor to transition to an inactive state in response to said input control signal; and
   a voltage clamp stage having a second transistor responsive to said input control signal such that said terminal is electrically-coupled to a reference voltage when said first transistor is in said inactive state.

2. The combination of claim 1 wherein each of said first and said second transistors are MOSFET devices.

3. The combination of claim 1 wherein said first transistor is an nMOS transistor and said second transistor is a pMOS transistor.

4. The combination of claim 1 wherein said reference voltage is a ground voltage source.

5. A silicon-on-insulator driver circuit comprising:
   a first transistor having a gate terminal electrically-coupled to a control signal conductor, said first transistor having a source terminal for providing a driver output signal, and a drain terminal for electrically-coupling with a combinational logic circuit;
   a second transistor having a gate terminal electrically-coupled to said control signal conductor, a source terminal electrically-coupled to said source terminal of said first transistor, and a drain terminal electrically-coupled to a body terminal of said first transistor, said second transistor charging a semiconductor body of said first transistor through said body terminal in response to a first signal transmitted through said control signal conductor; and a third transistor having a gate terminal electrically-coupled to said control signal conductor, a source terminal electrically-coupled to said drain terminal of said first transistor, and a drain terminal electrically-coupled to a voltage reference, said third transistor for selectively coupling said drain terminal of said first transistor to said voltage reference in response to a second signal transmitted through said control signal conductor.

6. The driver circuit of claim 5, wherein said first and said second transistors are nMOS transistors.

7. The driver circuit of claim 6 wherein said third transistor is a pMOS transistor.

8. The driver circuit of claim 6 wherein said third transistor is a nMOS transistor having an inverter input to said gate terminal of said third transistor.

9. The driver circuit of claim 5 wherein said voltage reference is a ground voltage source.

10. The driver circuit of claim 5 wherein said combinational logic circuit comprises a fourth transistor having a gate terminal electrically-coupled to a logic input signal conductor, a source terminal electrically-coupled to said drain terminal of said first transistor, and a drain terminal electrically-coupled to said voltage reference.

11. The driver circuit of claim 9 wherein said voltage reference is a ground voltage source.

12. The driver circuit of claim 5 wherein said combinational logic circuit is a NAND logic circuit.

13. A silicon-on-insulator wordline driver circuit comprising:

a body voltage control stage responsive to an input control signal to provide an output driver signal, said body voltage control stage having a metal-oxide semiconductor field-effect transistor ("MOSFET") with a terminal for coupling to a first combinational logic circuit, and a body contact electrically-coupled to said input control signal such that a threshold voltage of said MOSFET is reduced, when said MOSFET is placed in an active state, whereby said reduced threshold voltage of said MOSFET increases the rate for said MOSFET to transition between a first and a second logic voltage level in response to said input control signal;

a voltage clamp stage having a second MOSFET responsive to said input control signal such that said terminal is electrically-coupled to a reference voltage when said first MOSFET is in said inactive state;

a negative-logic body voltage control stage responsive to said input control signal to provide an output driver signal, said body voltage control stage having a third MOSFET with a terminal for coupling to a second combinational logic circuit, and a body contact electrically-coupled to said input control signal such that a threshold voltage of said MOSFET is reduced when said MOSFET is placed in an active state, whereby said reduced threshold voltage of said MOSFET increases the rate for said MOSFET to transition said first and said second logic voltage level in response to said input control signal; and a negative-logic voltage clamp stage having a fourth MOSFET responsive to said input control signal such that said terminal is electrically-coupled to a reference voltage when said third MOSFET is in said inactive state.

14. The wordline driver circuit of claim 13 wherein each of said MOSFETs is a CMOS device.

15. The wordline driver circuit of claim 13 wherein said reference voltage is a ground voltage source.

* * * * *